United States Patent [19]

Nishigoori

[11] Patent Number: 5,245,210

[45] Date of Patent: Sep. 14, 1993

[54] MOS TYPE SEMICONDUCTOR DEVICE

[75] Inventor: Tadashi Nishigoori, Tokyo, Japan

[73] Assignee: NEC Corporation, Japan

[21] Appl. No.: 742,918

[22] Filed: Aug. 9, 1991

[30] Foreign Application Priority Data

Aug. 11, 1990 [JP] Japan ................... 2-213236

[51] Int. Cl.5 ............................. H01L 23/48
[52] U.S. Cl. .................................... 257/382
[58] Field of Search ................ 357/23.4, 71; 257/382, 257/383

[56] References Cited

U.S. PATENT DOCUMENTS 4,914,050  4/1990  Shibata ................. 257/382
5,060,045 10/1991  Owada et al. ........... 357/71
5,103,285  4/1992  Furumura et al. ........ 257/382

Primary Examiner—James W. Davie
Attorney, Agent, or Firm—Laff, Whitesel, Conte & Saret

[57] ABSTRACT

In a MOS type semiconductor device, a first contact hole having a length similar to a width of source/drain diffusion layers is opened in a first layer insulation film. In the first contact hole, a refractory metal or the like is filled and a second layer insulation film is formed to cover the same. In the second layer insulation film, a second contact hole having an area smaller than that of the first contact hole is opened and, through this second contact hole, an aluminum interconnection and the source/drain regions are electrically connected. Therefore, it becomes possible to avoid decrease of ON current of a transistor owing to resistance elements of the source/drain diffusion layers and at the same time to reduce an area occupied by the aluminum interconnection to be connected to the source/drain regions on a transistor device.

3 Claims, 4 Drawing Sheets

MOS TYPE SEMICONDUCTOR DEVICE

BACKGROUND OF THE INVENTION

1. Field of the Invention

The present invention relates to a Metal Oxide Semiconductor (MOS) type semiconductor device, particularly to its junction structure between source/drain diffusion layers and metallic interconnections.

2. Description of the Prior Art

A representative example of this type of semiconductor device of a prior art is shown in FIG. 1(a) by way of a plan view and in FIG. 1(b) by way of a cross section along the line A—A' shown in FIG. 1(a).

In these drawings of FIGS. 1(a) and 1(b), 1 denotes a silicon substrate, 2 denotes a field oxide film, 3 denotes a gate oxide film, 4 denotes a gate electrode, 5 denotes a low concentration diffusion layer, 6 denotes a side wall oxide film, 7 denotes a high concentration diffusion layer, 8 denotes a first layer insulation film, 11 denotes an aluminum interconnection and 14 denotes a contact hole.

Up to the present, electric connection between a diffusion layer region and an aluminum interconnection, particularly in a transistor having a large width of a diffusion layer (length in a channel width direction), has been made by opening a contact hole 14 on a diffusion layer near a gate electrode 4 in a direction along which the gate electrode extends and patterning an aluminum interconnection 11 to cover the contact hole 14 thereby, as shown in FIGS. 1(a) and 1(b), in order to suppress decrease of ON current of the transistor owing to resistance of the diffusion layer.

In a semiconductor integrated circuit having logic gates, ratio of an area occupied by aluminum interconnections to an area of the entire chip is very large, particularly when compared with that of a memory series semiconductor integrated circuit. Therefore, it is a significant subject for enhancing integration degree, how the aluminum interconnections are disposed in an efficient manner. In a transistor of prior art structure, when it has a large width of a diffusion layer, aluminum interconnections for connection to the diffusion layer are disposed to surround a gate electrode in a channel portion, and so it is impossible to dispose other aluminum interconnections in this portion of the transistor, hence efficient disposition of aluminum interconnections has been obstructed.

SUMMARY OF THE INVENTION

An object of the present invention therefore is to realize efficient disposition of interconnections on a MOS semiconductor device without giving adverse influence against device characteristics and thus to enable to obtain a more compact and dense device.

The present invention thus provides a metal oxide semiconductor type semiconductor device comprising:

(a) a semiconductor substrate, (b) a gate electrode formed on the substrate with an interposed gate insulation film, (c) a diffusion layer formed in surface region of the substrate at each side of the gate electrode, (d) a first layer insulation film having a first contact hole formed on the diffusion layer to extend along the gate electrode in the direction of width of the gate electrode, (e) a refractory metal or metal silicide film filled in the first contact hole, (f) a second layer insulation film having a second contact hole formed on the refractory metal or metal silicide film to have an area smaller than that of the first contact hole, and (g) a metal interconnection extending on the second layer insulation film and contacting the refractory metal or metal silicide film through the second contact hole.

DESCRIPTION OF THE PREFERRED EMBODIMENTS

The present invention will be explained below further in detail with respect to its some embodiments.

Figure 1A:
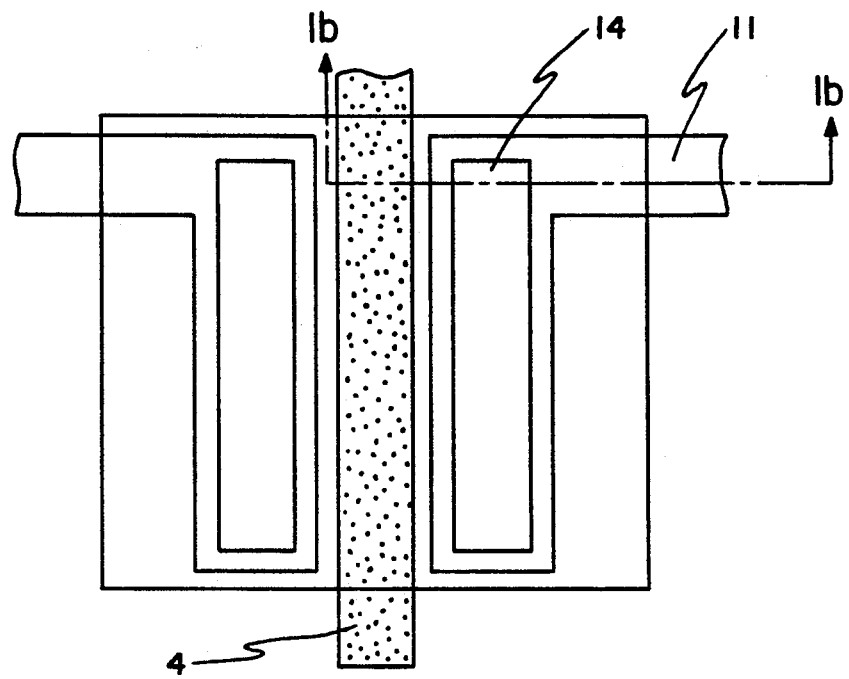
FIG. 1(a) shows a plan view of a prior art semiconductor device; and FIG. (b) shows its cross section along the line A—A' shown in FIG. 1(a).
Figure 1B:
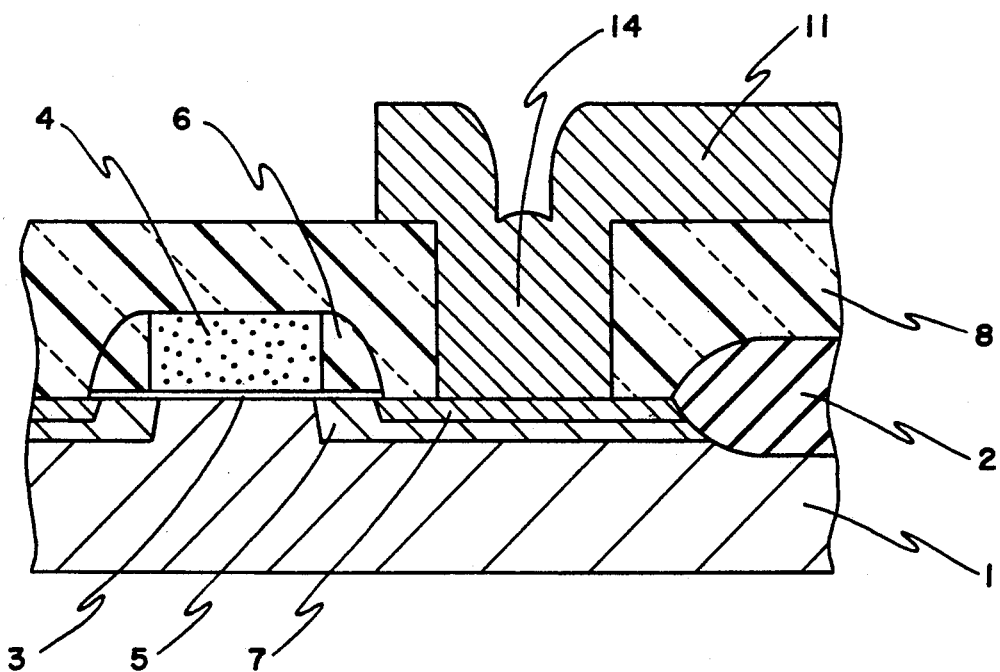
Figure 2A:
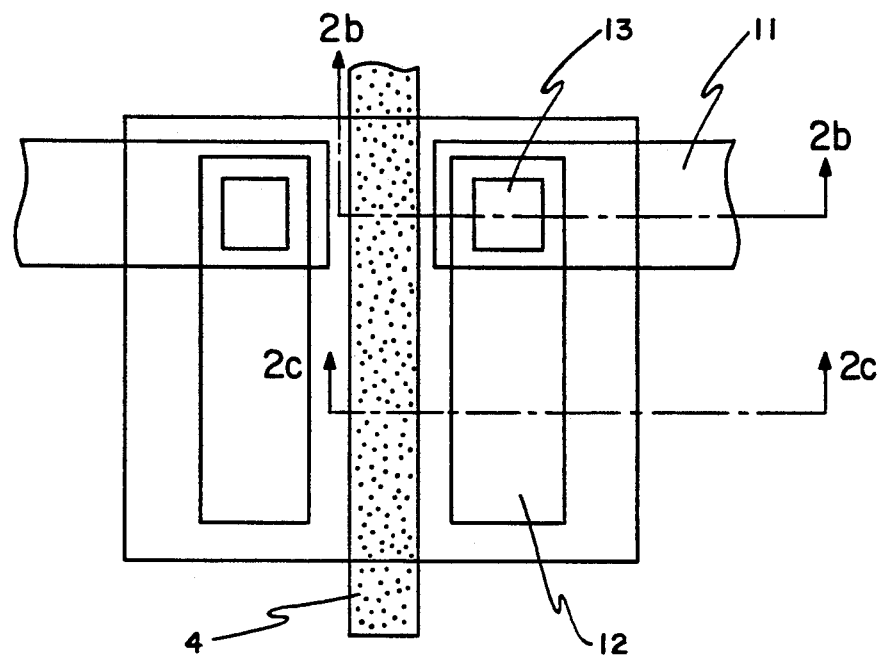
FIG. 2(a) shows a plan view of an embodiment of a semiconductor device according to the present invention.
Figure 2B:
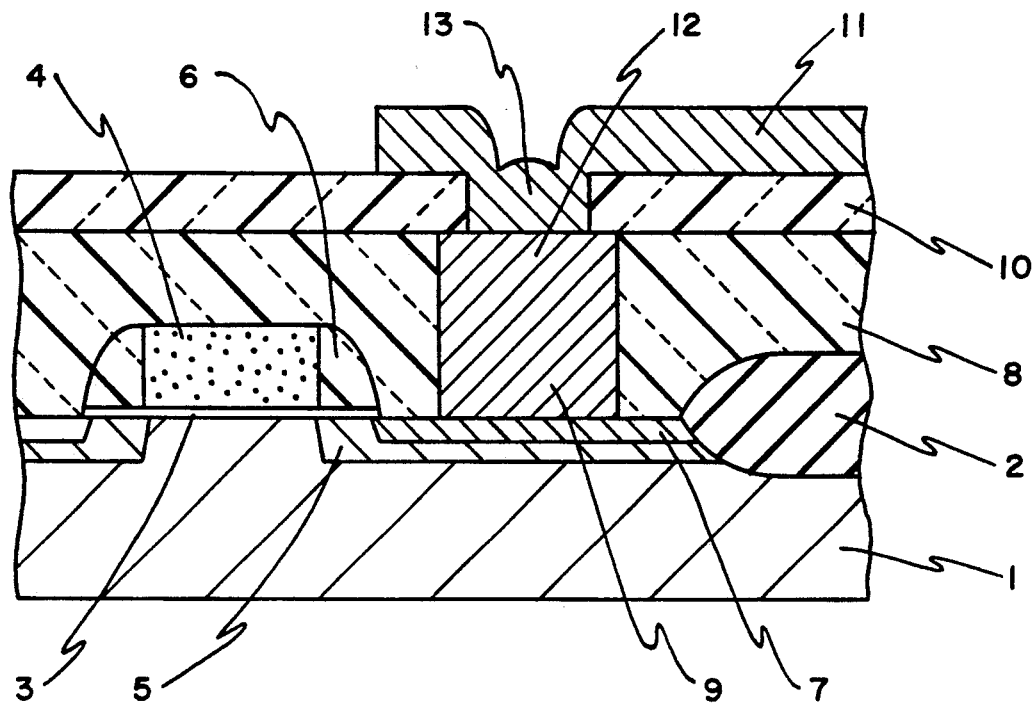
FIGS. 2(b) and 2(c) show its cross sections along the lines A—A' and B—B' shown in FIG. 2(a), respectively.
Figure 2C:
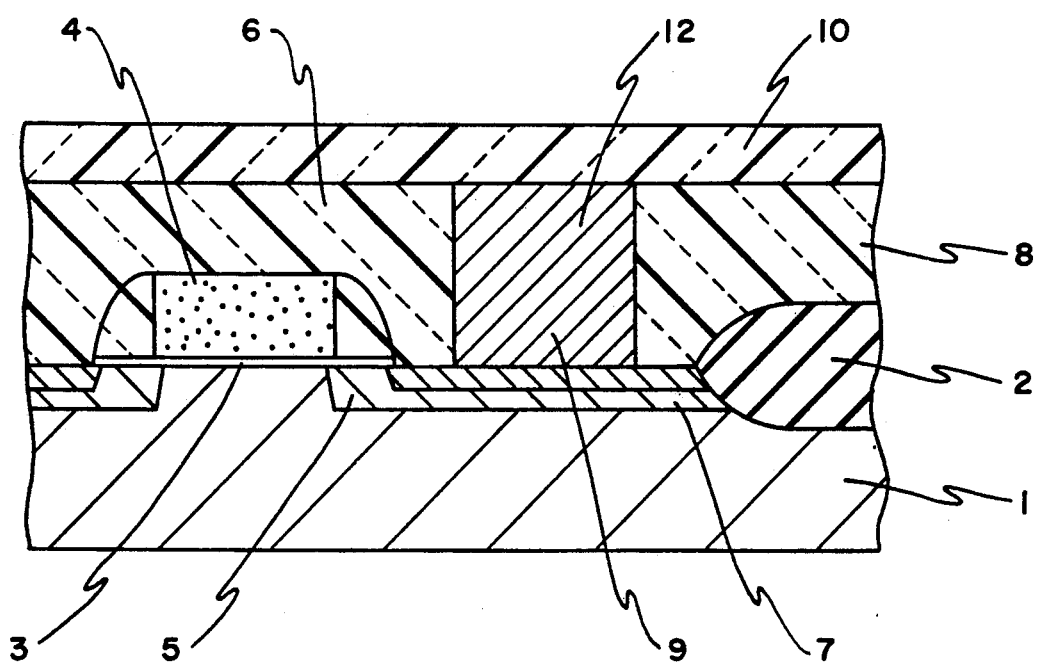

In the first embodiment as shown in FIGS. 2(a) to 2(c), elements shown by reference numerals same as those used in FIGS. 1(a) and 1(b) mean similar elements.

In this first embodiment, as shown in FIG. 2(a), a first contact hole 12 is formed to extend in the direction along which a gate electrode 4 extends, for obtaining electric connection with source/drain regions of a transistor. A second contact hole 13 is formed on a portion of the first contact hole 12. As shown in FIG. 2(b), the first contact hole 12 formed in the first layer insulation film 8 is filled with refractory metal film 9. On the first layer insulation film 8, a second layer insulation film 10 is formed to have a second contact hole 13 opening at a portion of the refractory metal film 9 filled in the first contact hole 12. Through this second contact hole 13, the refractory metal film 9 is electrically connected to an alluminium interconnection 11 formed as an uppermost layer. On the other hand, as shown in FIG. 2(c), at the other portion of the refractory metal film 9, the refractory metal film 9 is covered with the second layer insulation film 10.

According to the present invention, as above explained, electric connection between the alluminium interconnection 11 and the diffusion layers 5 and 7 is obtained by the interposed refractory metal film 9. Further, the electric connection between the refractory metal film 9 and the diffusion layers 5 and 7 is obtained by means of the larger first contact hole 12, whereas the electric connection between the alluminium interconnection 11 and the refractory metal film 9 is obtained by means of the smaller second contact hole 13. It is therefore possible to avoid influence of resistance of the diffusion layers and at the same time to minimize the area occupied by the alluminium interconnection to be connected to the diffusion layers on the surface of the semiconductor device.

Figure 3A:
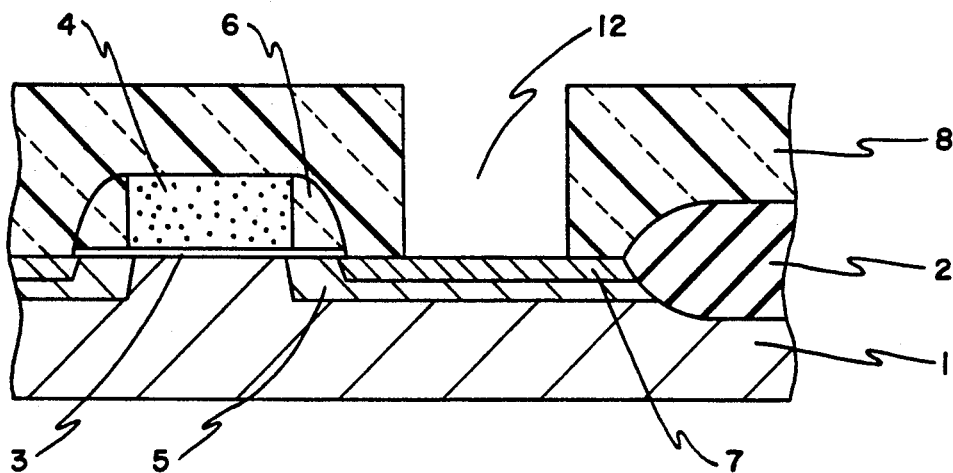
FIG. 3(a) to 3(c) show sectional views explaining production steps of the embodiment shown in FIGS. 2(a) to 2(c).

Next, production steps of the embodiment shown in FIGS. 2(a) to 2(c) are explained with reference to FIGS. 3(a) to 3(c).

On a silicon substrate 1, a field oxide film 2, a gate electrode 3, a gate electrode 4 and a side wall oxide film 6 are formed, and in a surface region of the silicon substrate 1, a low concentration diffusion layer 5 and a high concentration diffusion layer 7 are formed, respectively by an ordinary method by itself known in the art. Then the entire surface is covered with a first layer insulation film 8 and a first contact hole 12 is opened in the first layer insulation film 8 on the diffusion layers 5 and 7, so as to have a longitudinal shape extending along the gate electrode 3 [FIG. 3(a)].

Figure 3B:
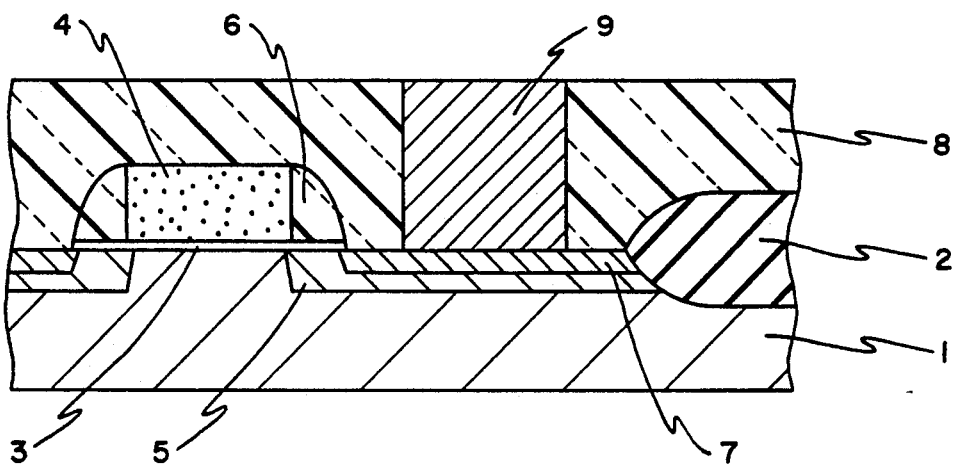

Next, in the first contact hole 12, tungsten is selectively grown and deposited to form a refractory metal film 9 [FIG. 3(b)].

Figure 3C:
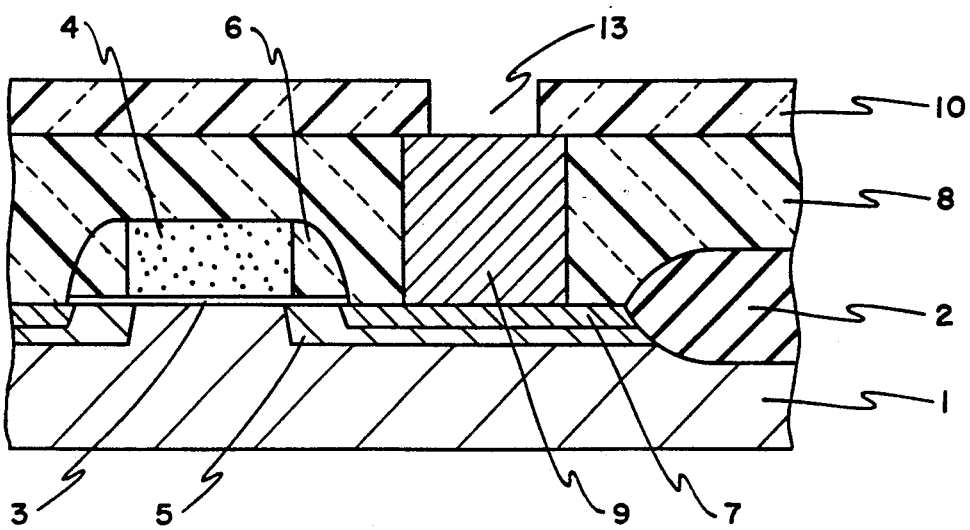

Then on the entire surface, a second layer insulation film 10 is formed and a second contact hole 13 is opened therein to expose a portion of the refractory metal film 9 filled in the first contact hole 12 [FIG. 3(c)].

Finally, an alluminium interconnection 11 is formed on the second layer insulation film 10 to have a contact with the refractory metal film 9 through the second contact hole 13. Thus the embodiment shown in FIGS. 2(a) to 2(c) is obtained. Although not shown in FIGS. 2(a) to 2(c), it is of course possible to dispose other alluminium interconnections on the second layer insulation film 10, in parallel with the alluminium interconnection 11, as occasion demands.

Figure 4:
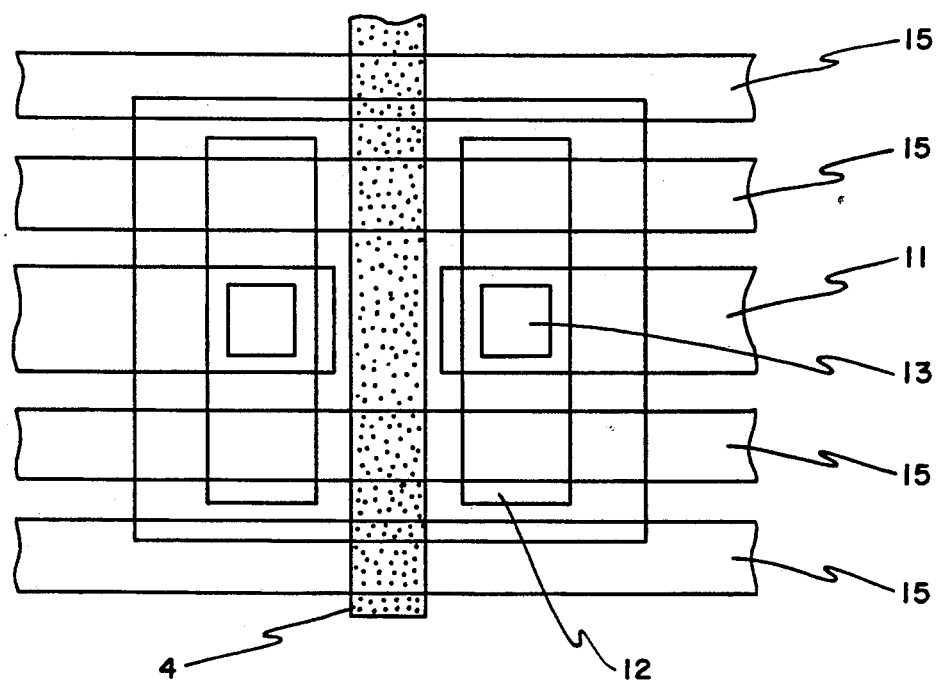
FIG. 4 shows a plan view of another embodiment of a semiconductor device according to the present invention.

In FIG. 4, another embodiment of the present invention is shown by way of a plan view. This second embodiment is different from the first embodiment at a point that the second contact hole 13 is disposed approximately at the center of the first contact hole 12 and in addition to the alluminium interconnection 11 to be connected to source/drain regions through these contact holes, other alluminium interconnections 15 are formed on the device surface in parallel with the alluminium interconnection 11.

In the above embodiments, tungsten is used as the refractory metal to be filled in the first contact hole, but it is of course possible to use other refractory metals or metal silicides.

As explained in detail above, according to the present invention, a first contact hole having a length similar to a width of source/drain diffusion layers is opened in a first layer insulation film. In the first contact hole, a refractory metal or the like is filled and a second layer insulation film is formed to cover the same. In the second layer insulation film, a second contact hole having an area smaller than that of the first contact hole is opened and, through this second contact hole, an alluminium interconnection and the source/drain regions are electrically connected. Therefore, it becomes possible to avoid decrease of ON current of a transistor owing to resistance elements of the source/drain diffusion layers and at the same time to reduce an area occupied by the alluminium interconnection to be connected to the source/drain regions on a transistor device. Accordingly, it becomes possible to dispose other alluminium interconnections on a transistor surface without badly affecting transistor characteristics. This contributes to miniaturization and densifying of a semiconductor device.

I claim:

1. A metal oxide semiconductor type semiconductor device comprising:
   (a) a semiconductor substrate,
   (b) a gate electrode formed on said substrate with an interposed gate insulation film,
   (c) a diffusion layer formed in a surface region of said substrate at each side of said gate electrode,
   (d) a first layer of insulation film having a first contact hole formed on said diffusion layer to extend along said gate electrode in a width direction of said gate electrode,
   (e) a refractory metal or metal silicide film filled in said first contact hole,
   (f) a second layer insulation film having a second contact hole formed on said refractory metal or metal silicide film to have an area smaller than that of said first contact hole, and
   (g) a metal interconnection extending on said second layer insulation film and contacting said refractory metal or metal silicide film through said second contact hole.

2. The metal oxide semiconductor type semiconductor device according to claim 1, wherein said refractory metal is tungsten and said metal interconnection is alluminium.

3. A semiconductor device comprising a semiconductor substrate, source and drain regions selectively formed in said semiconductor substrate, a gate insulating film formed on said semiconductor substrate between said source and drain regions, a gate electrode formed on said gate insulating film, a first insulating layer covering said gate electrode and said source and drain regions, a first contact hole selectively formed in said first insulating layer to expose a part of at least one of said source and drain regions along said gate electrode, a first conductive layer filling said first contact hole, a second insulating layer covering said first insulating layer and said first conductive layer, a second contact hole having an area smaller than the area of said first contact hole and exposing a part of said first conductive layer, and a second conductive layer formed in contact with the part of said first conductive layer through said first contact hole and elongated over said second insulating layer.

* * * * *